US 6,727,717 B2

(12) United States Patent
Kim et al.

(10) Patent No.: US 6,727,717 B2
(45) Date of Patent: Apr. 27, 2004

(54) INTEGRATED CIRCUIT CHIP TEST ADAPTER

(75) Inventors: David J. Kim, San Jose, CA (US); Anthony Kozaczuk, Burlingame, CA (US); Wenjun Bill Chen, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 146 days.

(21) Appl. No.: 09/965,275

(22) Filed: Sep. 27, 2001

(65) Prior Publication Data
US 2003/0057983 A1 Mar. 27, 2003

(51) Int. Cl.[7] .............................................. G01R 31/02
(52) U.S. Cl. ....................................................... 324/755
(58) Field of Search ........................... 324/754, 755, 324/757, 759, 761, 763, 765, 158.1, 690, 750; 438/6, 618, 80, 15

(56) References Cited

U.S. PATENT DOCUMENTS

| | | |
|---|---|---|
| 5,477,161 A | 12/1995 | Kardos et al. |
| 5,559,445 A | 9/1996 | Eaddy et al. |
| 5,896,037 A * | 4/1999 | Kudla et al. ............... 324/755 |
| 6,593,763 B2 | 7/2003 | Weber |

* cited by examiner

Primary Examiner—Kamand Cuneo
Assistant Examiner—Trung Q. Nguyen
(74) Attorney, Agent, or Firm—Meyertons Hood Kivlin Kowert & Goetzel, P.C.; B. Noël Kivlin

(57) ABSTRACT

An apparatus for testing an integrated circuit chip includes a printed circuit device having connector pads, contacts, and traces extending between at least some of the connector pads and the contacts. The printed circuit device has openings therethrough, intersecting the contacts, that are adapted to receive the pins extending from the integrated circuit chip so that the contacts may electrically contact the pins extending from the integrated circuit chip. The apparatus further includes a connector electrically interconnected with at least some of the connector pads. The apparatus is adapted to be disposed between the integrated circuit chip and a chip socket, such that the pins extending from the integrated circuit chip may be inserted through the printed circuit device and into the chip socket.

24 Claims, 4 Drawing Sheets

FIG. 4

INTEGRATED CIRCUIT CHIP TEST ADAPTER

BACKGROUND OF THE INVENTION

1. Field of the Invention

This invention relates to a method and apparatus for testing an integrated circuit chip.

2. Description of the Related Art

Computer systems are general-purpose devices that may be modified to perform particular tasks or functions. Generally, computer systems include a motherboard, a power source, and other components mounted within an enclosure. The motherboard typically includes a number of connectors or slots in which special purpose printed circuit boards or "daughter cards", e.g., peripheral component interface (PCI) bus cards, industry standard architecture (ISA) bus cards, proprietary bus cards, and the like, may be inserted. These special purpose cards may be used to add to or enhance the functionality of the computer system. For example, a conventional computer system may have its graphics capability enhanced by the addition of a graphics card. Similarly, the sound-producing capability of the computer system may be enhanced by the addition of a sound card.

Such motherboards and daughter cards may include one or more integrated circuit chips, such as central processing unit (CPU) chips or microprocessors. During the development of a new integrated circuit chip, it is often desirable to test the integrated circuit chip by delivering various signals to the integrated circuit chip, as well by monitoring various signals being delivered from the integrated circuit chip. It is also often desirable to perform such tests while the integrated circuit chip is installed and operating in a computer system.

Generally, conventional integrated circuit chip test adapters are used by inserting pins extending from the integrated circuit chip to be tested into contacts of a chip socket of the test adapter. The test adapter chip socket also has pins extending therefrom, and these pins are then inserted into contacts of a chip socket of the motherboard or daughter card in which the integrated circuit chip is to be used. Testing equipment may be attached to leads extending from the contacts of the test adapter chip socket. The additional electrical interconnections between the integrated circuit chip and the motherboard/daughter card chip socket, as well as the increased conductor length from the integrated circuit chip pins to the motherboard/daughter card chip socket, may affect the signals delivered to and received from the integrated circuit chip, thus affecting the integrated circuit chip's operation.

Further, conventional integrated circuit chip test adapters may lack the ability to provide electrical contact with all pins of the integrated circuit chip, especially integrated circuit chips having hundreds or even thousands of pins extending therefrom.

SUMMARY OF THE INVENTION

In one aspect of the present invention, an apparatus for testing an integrated circuit chip is presented. The apparatus includes a printed circuit device having connector pads, contacts, and traces extending between at least some of the connector pads and the contacts. The printed circuit device has openings therethrough, intersecting the contacts, that are adapted to receive the pins extending from the integrated circuit chip so that the contacts may electrically contact the pins extending from the integrated circuit chip. The apparatus further includes a connector electrically interconnected with at least some of the connector pads. The apparatus is adapted to be disposed between the integrated circuit chip and a chip socket, such that the pins extending from the integrated circuit chip may be inserted through the printed circuit device and into the chip socket.

In another aspect of the present invention, a test assembly is provided. The test assembly includes an integrated circuit chip having pins extending therefrom, a chip socket having contacts engaged with the pins extending from the integrated circuit chip, a printed circuit device disposed between the integrated circuit chip and the chip socket, and a connector. The printed circuit device has connector pads, contacts, and traces extending between the contacts and at least some of the connector pads. The printed circuit device further has openings therethrough, intersecting the contacts, through which the pins extending from the integrated circuit chip are disposed such that the contacts are engaged with the pins extending from the integrated circuit chip. The connector is electrically connected with at least some of the connector pads.

In yet another aspect of the present invention, a method is provided including inserting a test adapter between an integrated circuit chip and a chip socket such that pins extending from the integrated circuit chip are physically connected with contacts of the test adapter and with contacts of the chip socket.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
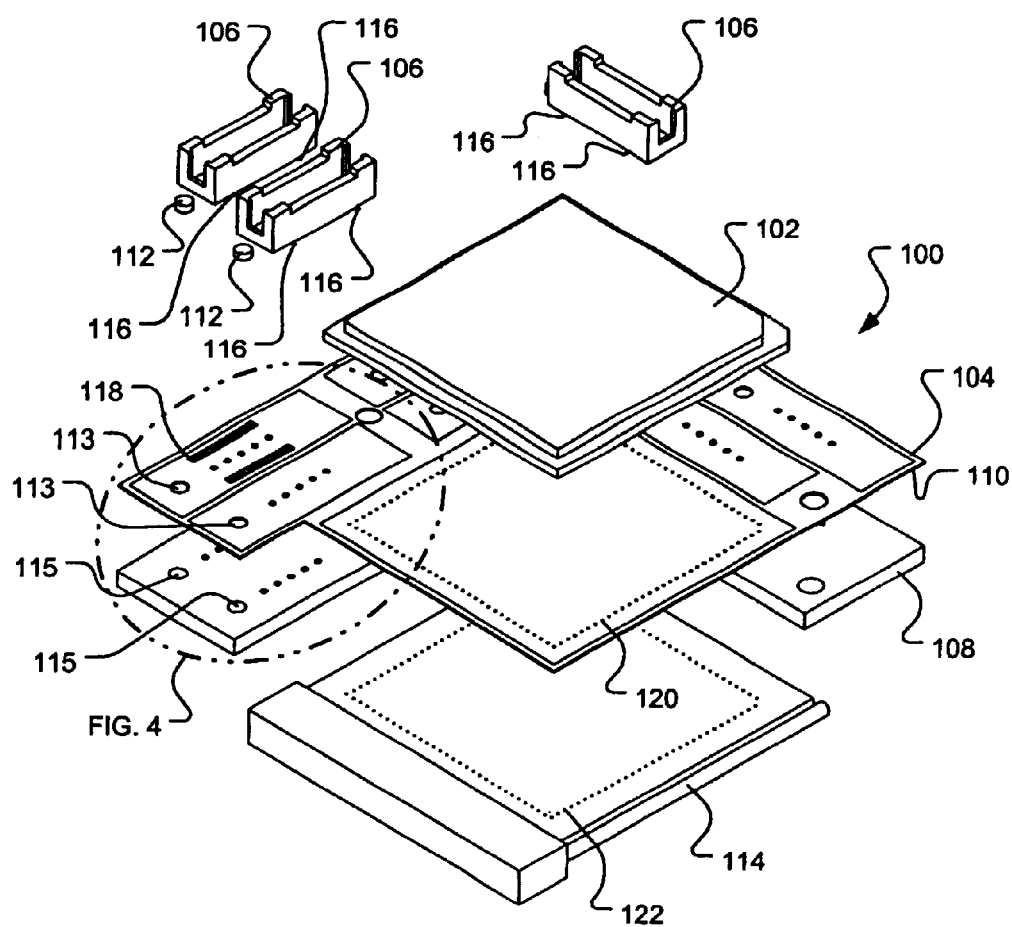
FIG. 1 is an exploded perspective view of an integrated circuit chip test adapter according to the present invention.
Figure 2:
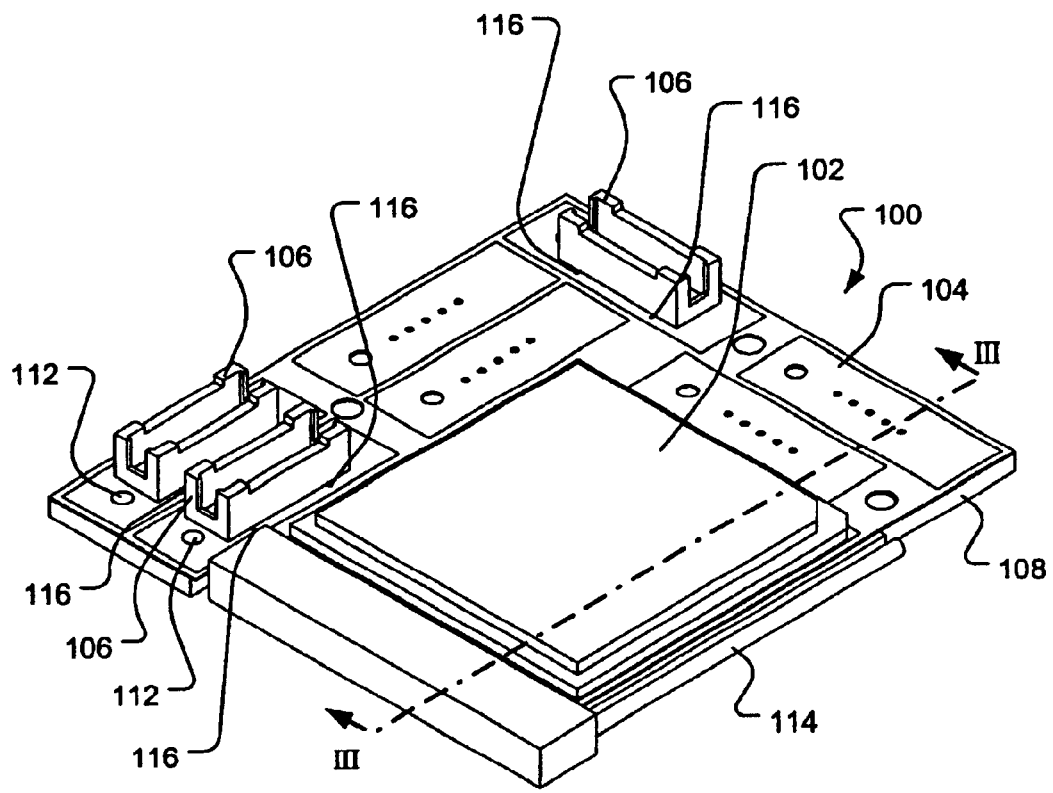
FIG. 2 is a perspective view of the integrated circuit chip test adapter of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and businessrelated constraints, which will vary from one implementation to another. Moreover, it will be appreciated that such a development effort might be complex and time-consuming but would nevertheless be a routine undertaking for those of ordinary skill in the art having the benefit of this disclosure.

A test adapter 100 according to the present invention for use in testing an integrated circuit chip 102 is illustrated in FIGS. 1–4. The test adapter 100 includes a printed circuit device 104, one or more connectors 106, and a backing plate 108. In one embodiment, the backing plate 108 is made of a dielectric material, such as phenolic, polyester, epoxy, acrylic, or the like. The backing plate 108 is attached to a lower surface 110 of the printed circuit device 104 by any suitable method. In the illustrated embodiment, the backing plate 108 is attached to the lower surface 110 of the printed circuit device 104 by fasteners 112, which are plastically formed through openings 113 in the printed circuit device 104 and openings 115 in the backing plate 108. In the illustrated embodiment, the fasteners 112 may be screws, nuts and bolts, clips, Christmas-tree fasteners, adhesives, heat-deformable thermoplastic plugs, or the like. Any number of fasteners 112 may be used to mount the backing plate 108 to the printed circuit device 104. The backing plate 108 provides support to the printed circuit device 104 to reduce the likelihood of damage to the printed circuit device 104 due to bending and the like. The backing plate 108 is shaped to accommodate a chip socket 114 under the printed circuit device 104 during use.

Contacts 116 (only two shown per connector 106) of the connectors 106 are electrically interconnected with connector pads 118 of the printed circuit device 104. The contacts 116 may be connected with the connector pads 118 by any suitable method, e.g., soldering, application of conductive adhesive, or the like.

The printed circuit device 104 has openings 120 (only one indicated) therethrough corresponding to contacts 122 (only one indicated) in the chip socket 114 and pins 302 (FIG. 3, only one indicated) extending from the integrated circuit chip 102, such that the pins 302 may be inserted through the openings 120 in the printed circuit device 104 and be engaged with the contacts 122 of the chip socket 114. The contacts 122 of the chip socket 114 may be electrically interconnected with one or more components of a computer system, such as a motherboard, a daughter card, or the like, so that the integrated circuit chip 102 can operate in a normal fashion in the computer system while being tested via the test adapter 100.

The pins 302 extending from the integrated circuit chip 102 generally have a specified length. Thus, the integrated circuit chip 102 may be spaced apart from the chip socket 114 by no more than a defined distance while remaining engaged with the contacts 122 of the chip socket 114. Accordingly, a thickness of the printed circuit device 104 may generally be no greater than this maximum spacing. In one embodiment, the maximum spacing between the integrated circuit chip 102 and the chip socket 114 is about 0.5 mm. In one embodiment of the present invention, the printed circuit device 104 comprises a flexible circuit device, such flex-circuits manufactured by Minco Products, Inc. of Minneapolis, Minn. and the like. In such flexible circuit devices, conductive lines or traces are produced on thin layers of a flexible material having a high dielectric constant, e.g., thermoset polyimide materials or the like. The layers may then be adhesively bonded to one another to produce a multi-layer flexible circuit device. Such flexible circuit devices can provide many layers of conductive lines or traces while minimizing the overall thickness of the device.

Figure 3:
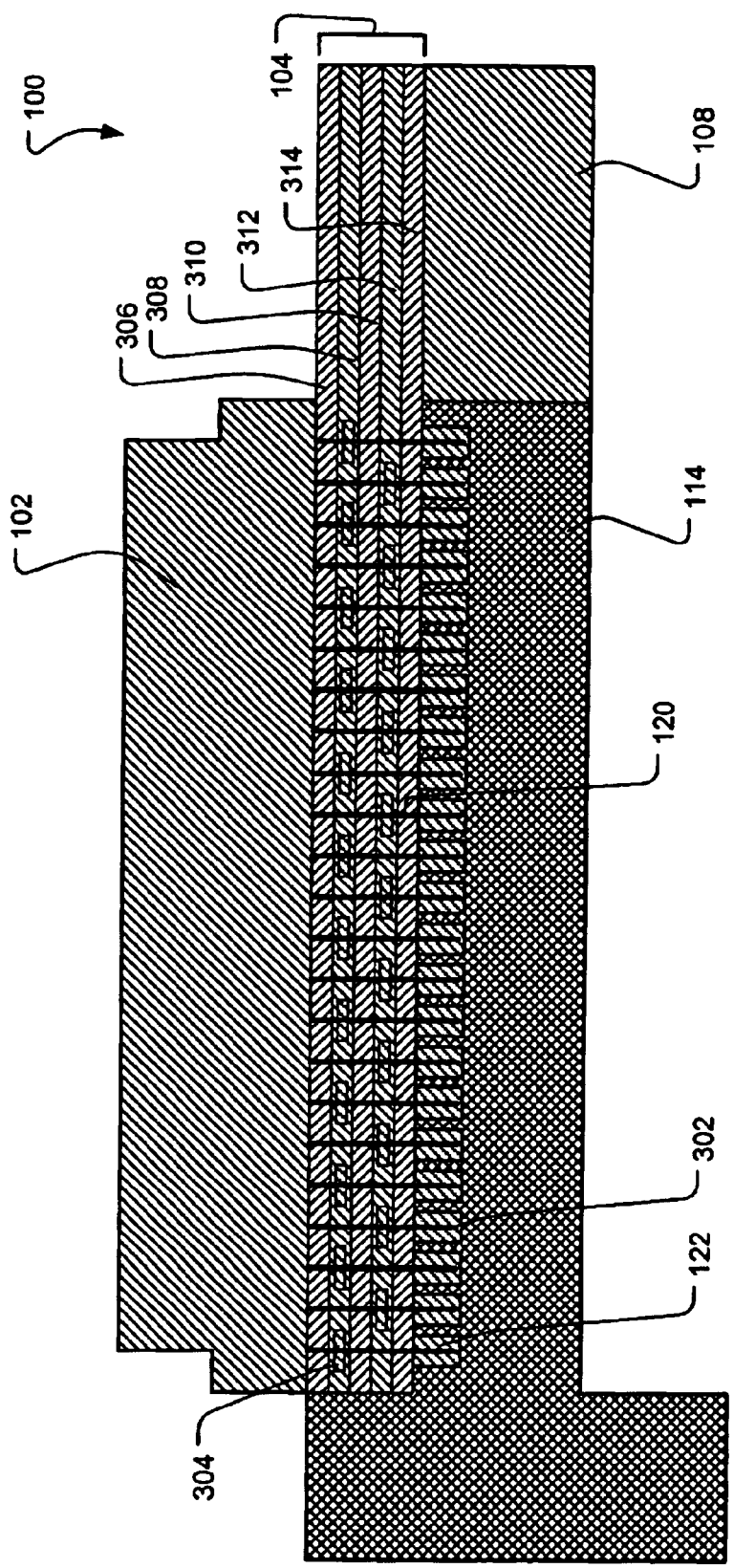
FIG. 3 is a stylized cross-sectional view of the integrated circuit chip test adapter of FIGS. 1 and 2 taken along the III—III line in FIG. 2.

FIG. 3 illustrates one embodiment of the printed circuit device 104 having two layers of conductive contacts 304 (only one indicated). The printed circuit device 104 includes a top dielectric layer 306. A first adhesive layer 308 bonds the top dielectric layer 306 to a middle dielectric layer 310. Between the top dielectric layer 306 and the middle dielectric layer 310, within the first adhesive layer 308, is a first layer of the conductive contacts 304. A second adhesive layer 312 bonds the middle dielectric layer 310 to a bottom dielectric layer 314. Between the middle dielectric layer 310 and the bottom dielectric layer 314, within the second adhesive layer 312, is a second layer of the conductive contacts 304. In one embodiment, the dielectric layers 306, 310, 314 are flexible dielectric layers and may be made of a polyimide material, e.g., Kapton® (manufactured by E.I. du Pont de Nemours and Company) or the like. The adhesive layers 308, 312 may be made from any suitable adhesive material, e.g., an acrylic adhesive, an epoxy adhesive, or the like. The conductive contacts 304 may be made from any suitable conductive material, e.g., copper, beryllium copper, cupro-nickel, silver epoxy, or the like. Each of the openings 120 extends through the printed circuit device 104 and intersects one of the conductive contacts 304 so that each of the pins 302, when inserted through the openings 120, may be electrically connected with the conductive contacts 304.

Figure 4:
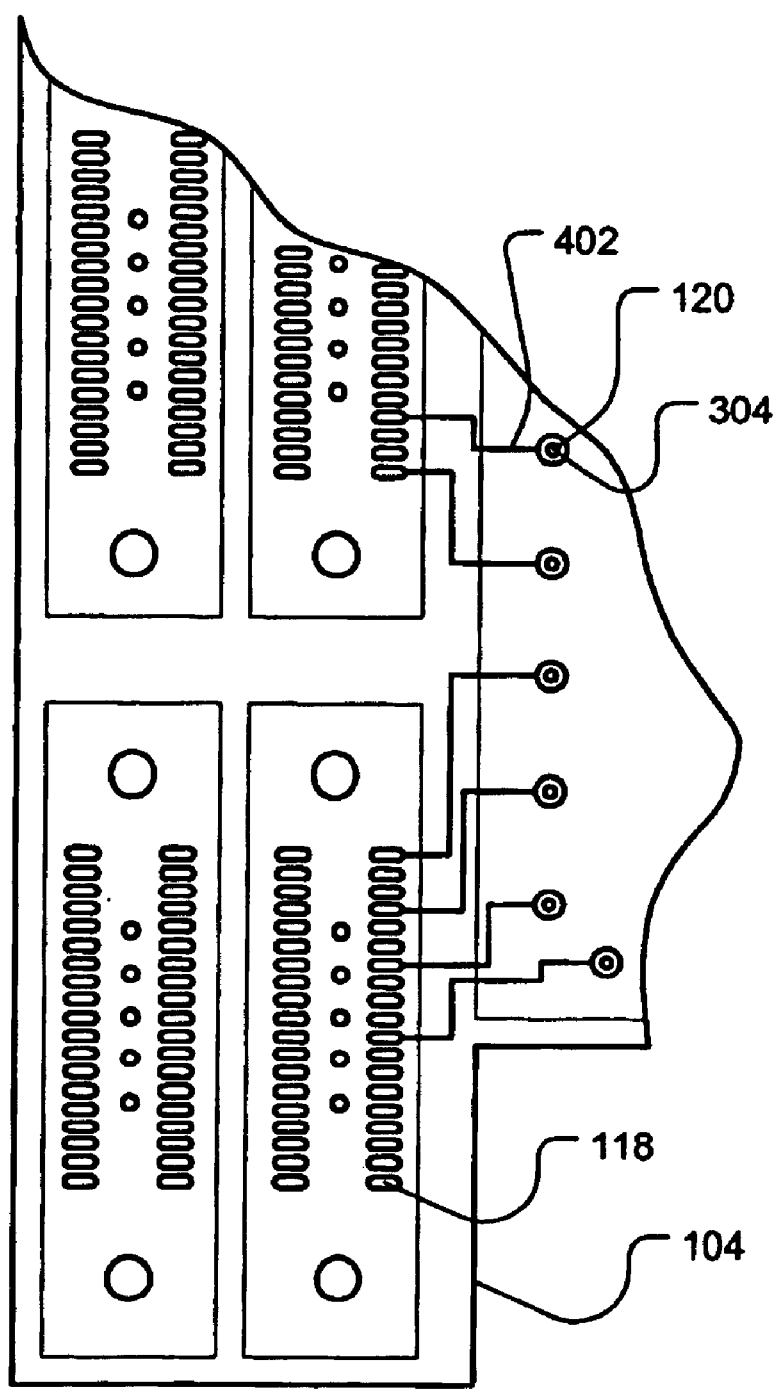
FIG. 4 is a partial plan view of a layer of a printed circuit device according to the present invention.

FIG. 4 illustrates electrical interconnections between part of one layer of the conductive contacts 304 and the connector pads 118. Conductive traces 402 extend between the conductive contacts 304 and the connector pads 118 in a desired configuration. While a particular configuration of the traces 402 is shown in FIG. 4, the present invention encompasses any desired configuration of the traces 402. In other words, the traces 402 may extend in any desired pattern between the conductive contacts 304 and the connector pads 118. Further, it is within the scope of the present invention for one or more conductive contacts 304 to have no electrical connection with any of the connector pads 118. Generally, the printed circuit device 104 has a number of layers of traces 402 corresponding to the number of layers of conductive contacts 304.

Accordingly, when the pins 302 of the integrated circuit chip 102 are inserted through the openings 120 in the printed circuit device 104 and engaged with the contacts 122 of the chip socket 114, the pins 302 extending from the integrated circuit chip 102 are physically connected with the contacts 304 printed circuit device 104 and with the contacts 122 of the chip socket 114. Thus, various circuits within the integrated circuit chip 102 can be monitored and tested while the integrated circuit chip 102 is operating in a computer system or a portion of a computer system. A testing device (not shown) may be interconnected to the test adapter 100 via the connectors 106. The testing device may be an oscilloscope, a signal generator, a logic analyzer, or the like. Thus, electrical signals may be delivered by the test equipment to the integrated circuit chip 102 via the test adapter 100 and electrical signals, delivered by the integrated circuit chip 102, may be monitored by the test equipment via the test adapter 100.

The test adapter 100 of the present invention is particularly useful in the testing of an integrated circuit chip 102 having many hundreds or even thousands of pins 302. To make contact with each of the pins 302 in an integrated circuit chip 102 having such a large number of pins 302, multiple layers of the conductive contacts 304 and the traces 402 may be required. The thickness of the printed circuit device 104, however, may not exceed the maximum spacing between the integrated circuit chip 102 and the chip socket 114, as described above.

In one embodiment, the printed circuit device 104 is capable of providing contact with an integrated circuit chip 102 having 959 pins 302. The printed circuit device 104 has five layers of conductive contacts 304 and conductive traces 402, resulting in six dielectric layers (e.g., the dielectric layers 306, 310, 314) and five adhesive layers (e.g., the adhesive layers 308, 312). In such an embodiment, each of the dielectric layers and each of the adhesive layers has a thickness of about 0.025 mm. Each of the conductive contacts 304 and the corresponding conductive traces 402 has a thickness of about 0.033 mm. Thus, in this example, the thickness of the printed circuit device 104 is about 0.440 mm. The present invention, however, encompasses a printed circuit device 104 having any number of layers and having any thickness suitable for the particular integrated circuit chip 102 and chip socket 114 being tested.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. An apparatus for testing an integrated circuit chip, comprising:
   a printed circuit device having connector pads, contacts, and traces extending between at least some of the connector pads and the contacts, wherein the printed circuit device has openings therethrough, intersecting the contacts, that are adapted to receive pins extending from the integrated circuit chip so that the contacts may electrically contact the pins extending from the integrated circuit chip; and
   a connector electrically interconnected with at least some of the connector pads,
   wherein the apparatus is adapted to be disposed between the integrated circuit chip and a chip socket, such that the pins extending from the integrated circuit chip may be inserted through the printed circuit device and into the chip socket.

2. An apparatus, according to claim 1, wherein the printed circuit device further comprises:
   a first flexible dielectric layer having a first surface and a second surface;
   a second flexible dielectric layer having a first surface; and
   an adhesive layer bonding the first surface of the first flexible layer and the first surface of the second flexible layer,
   wherein the contacts and the traces are disposed on the first surface of the first flexible dielectric layer, the connector pads extend through the first flexible dielectric layer to the first surface of the first flexible dielectric layer and the second surface of the first flexible dielectric layer, and the second flexible dielectric layer substantially covers the first surface of the first flexible dielectric layer, the connector pads, the contacts, and the traces.

3. An apparatus, according to claim 2, wherein the first flexible dielectric layer and the second flexible dielectric layer are made of a polyimide material.

4. An apparatus, according to claim 2, wherein the adhesive layer is comprised of a material selected from the group consisting of an acrylic adhesive or an epoxy adhesive.

5. An apparatus, according to claim 1, wherein the printed circuit device has a thickness no greater than about 0.5 mm.

6. An apparatus, according to claim 1, wherein the printed circuit device has a lower surface and wherein the apparatus further comprises a backing plate attached to the lower surface of the printed circuit device.

7. An apparatus, according to claim 6, further comprising a fastener for attaching the backing plate to the lower surface of the printed circuit device.

8. An apparatus, according to claim 6, wherein the backing plate is made of a dielectric material.

9. An apparatus, according to claim 1, wherein the printed circuit device further comprises a plurality of layers of contacts and traces.

10. An apparatus, according to claim 9, wherein the plurality of layers of contacts and traces further comprises a plurality of flexible dielectric layers on which the layers of contacts and traces are disposed and wherein the plurality of flexible dielectric layers are adhesively bonded to one another.

11. A test assembly, comprising:
    an integrated circuit chip having pins extending therefrom;
    a chip socket having contacts engaged with the pins extending from the integrated circuit chip;
    a printed circuit device disposed between the integrated circuit chip and the chip socket; and
    a connector,
    wherein the printed circuit device has connector pads, contacts, and traces extending between the contacts and at least some of the connector pads;
    wherein the printed circuit device has openings therethrough, intersecting the contacts, through which the pins extending from the integrated circuit chip are disposed such that the contacts are engaged with the pins extending from the integrated circuit chip; and
    wherein the connector is electrically connected with at least some of the connector pads.

12. A test assembly, according to claim 11, further comprising a motherboard electrically interconnected with the chip socket.

13. A test assembly, according to claim 11, further comprising a daughtercard electrically interconnected with the chip socket.

14. A test assembly, according to claim 11, wherein the printed circuit device further comprises:
    a first flexible dielectric layer having a first surface and a second surface;
    a second flexible dielectric layer having a first surface; and
    an adhesive layer bonding the first surface of the first flexible dielectric layer and the first surface of the second flexible dielectric layer,
    wherein the contacts and the traces are disposed on the first surface of the first flexible dielectric layer, the connector pads extend through the first flexible dielectric layer to the first surface of the first flexible dielectric layer and the second surface of the first flexible dielectric layer, and the second flexible dielectric layer substantially covers the first surface of the first flexible dielectric layer, the connector pads, the contacts, and the traces.

15. A test assembly, according to claim 14, wherein the first flexible dielectric layer and the second flexible dielectric layer are made of a polyimide material.

16. A test assembly, according to claim 14, wherein the adhesive layer is comprised of a material selected from the group consisting of an acrylic adhesive or an epoxy adhesive.

17. A test assembly, according to claim 11, wherein the printed circuit device has a thickness no greater than about 0.5 mm.

18. A test assembly, according to claim 11, wherein the printed circuit device has a lower surface and wherein the test assembly further comprises a backing plate attached to the lower surface of the printed circuit device.

19. A test assembly, according to claim 18, further comprising a fastener for attaching the backing plate to the lower surface of the printed circuit device.

20. A test assembly, according to claim 18, wherein the backing plate is made of a dielectric material.

21. A test assembly, according to claim 11, wherein the printed circuit device further comprises a plurality of layers of contacts and traces.

22. A test assembly, according to claim 21, wherein the plurality of layers of contacts and traces further comprises a plurality of flexible dielectric layers on which the layers of contacts and traces are disposed and wherein the plurality of flexible dielectric layers are adhesively bonded to one another.

23. A test assembly, according to claim 11, wherein the contacts of the chip socket and the contacts of the printed circuit device are removably engaged with the pins extending from the integrated circuit chip.

24. A test assembly, according to claim 11, further comprising a testing device, electrically interconnected with the connector, for testing the integrated circuit chip.

* * * * *